(12) United States Patent  (10) Patent No.: US 8,183,166 B2
Lin  (45) Date of Patent: May 22, 2012

(54) DIELECTRIC LAYER STRUCTURE AND MANUFACTURING METHOD THEREOF

(75) Inventor: Chin-Hsiang Lin, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/949,739

(22) Filed: Nov. 18, 2010

(65) Prior Publication Data

US 2011/0065285 A1  Mar. 17, 2011

Related U.S. Application Data

(63) Continuation of application No. 11/834,643, filed on Aug. 6, 2007, now Pat. No. 7,858,532.

(51) Int. Cl.
*H01L 23/52* (2006.01)
*H01L 23/532* (2006.01)

(52) U.S. Cl. ............... 438/778; 257/E21.576

(58) Field of Classification Search ............. 438/778, 438/759, 763, 618, 622, 758, 795; 257/E21.576, 257/E21.328, E21.001
See application file for complete search history.

(56) References Cited

U.S. PATENT DOCUMENTS

| | | | |
|---|---|---|---|
| 5,366,929 A | 11/1994 | Cleeves | |
| 5,387,546 A | 2/1995 | Maeda et al. | |
| 6,010,943 A | 1/2000 | Liao | |
| 6,015,759 A | 1/2000 | Khan et al. | |
| 6,020,024 A | 2/2000 | Maiti | |
| 6,121,164 A | 9/2000 | Yieh | |
| 6,208,014 B1 | 3/2001 | Wu | |
| 6,294,473 B1 | 9/2001 | Oliver | |
| 6,297,532 B1 | 10/2001 | Yamamoto | |
| 6,548,901 B1 | 4/2003 | Cote | |
| 7,071,708 B2 | 7/2006 | Chou | |
| 7,381,451 B1 | 6/2008 | Lang | |
| 7,563,704 B2 * | 7/2009 | Yang et al. | 438/622 |
| 7,892,648 B2 * | 2/2011 | Edelstein et al. | 428/447 |
| 2001/0023125 A1 * | 9/2001 | Nishimoto et al. | 438/623 |
| 2005/0106762 A1 | 5/2005 | Chakrapani | |
| 2005/0227488 A1 | 10/2005 | O'Brien | |
| 2006/0043591 A1 | 3/2006 | Yim | |
| 2006/0073650 A1 * | 4/2006 | Sridhar et al. | 438/199 |

(Continued)

FOREIGN PATENT DOCUMENTS

JP 06267935 A * 9/1994

(Continued)

OTHER PUBLICATIONS

Kohl et al. "Low k, Porous Methyl Silsesquioxane and Spin-On-Glass." Electrochemical and Solid-State Letters vol. 2 (1999): p. 77-79.

(Continued)

*Primary Examiner* — Hsien Ming Lee
*Assistant Examiner* — Michele Fan
(74) *Attorney, Agent, or Firm* — Winston Hsu; Scott Margo

(57) ABSTRACT

A method for fabricating a dielectric layer structure includes providing a substrate, blanketly forming a low-k dielectric layer of an interlayer dielectric (ILD) layer, the low-k dielectric layer covering at least a first metal interconnect structure on the substrate, blanketly forming a single tensile film of the ILD layer having a thickness of 200-1500 angstroms on the low-k dielectric layer, and performing a moisture preventing treatment on the single tensile film. The single tensile layer possesses a stress comparative to a stress of the low-k dielectric layer and a hydrophobic characteristic that prevents itself from absorbing moisture.

19 Claims, 12 Drawing Sheets

U.S. PATENT DOCUMENTS

| | | |
|---|---|---|
| 2006/0146099 A1 | 7/2006 | Wang |
| 2006/0170836 A1 | 8/2006 | Kondo |
| 2007/0105297 A1 | 5/2007 | Jeong |
| 2007/0114667 A1 | 5/2007 | Bhatt |
| 2007/0281497 A1 | 12/2007 | Liu |
| 2008/0020570 A1 | 1/2008 | Naik |
| 2008/0122045 A1 | 5/2008 | Yang |
| 2008/0197513 A1 | 8/2008 | Restaino |
| 2009/0179003 A1 | 7/2009 | Nishimura |
| 2010/0122711 A1 | 5/2010 | Ryan |

FOREIGN PATENT DOCUMENTS

| | | |
|---|---|---|
| TW | I281223 | 5/2007 |
| TW | I282128 | 6/2007 |

OTHER PUBLICATIONS

Wang et al."Dielectric Properties and Frequency Response of Self-Assembled Monolayers pf Alkanethiols", Langmuir, vol. 20, No. 12, 2004: pp. 5007-5012.

* cited by examiner

US 8,183,166 B2

DIELECTRIC LAYER STRUCTURE AND MANUFACTURING METHOD THEREOF

CROSS REFERENCE TO RELATED APPLICATIONS

This is a continuation application of U.S. patent application Ser. No. 11/834,643, filed on Aug. 6, 2007, and all benefits of such earlier application are hereby claimed for this new continuation application.

BACKGROUND OF THE INVENTION

1. Field of the Invention

The present invention relates to a dielectric layer structure and manufacturing method thereof, and more particularly, to a dielectric layer structure having superior process control and stability and manufacturing method thereof.

2. Description of the Prior Art

Devices in semiconductor industry need to undergo several complicated processes such as photolithograph process, dry or wet etching process, ion implantation, and heat treatment, etc. to construct precise integrated circuits in layers. Among those complicated processes, the process control of dielectric layer etching has become a critical factor, particularly in some application such as damascene process or interconnection technique. For example, in a damascene process, a dielectric layer is etched to form patterns comprising trenches or via. Then the trenches or via are filled with copper, and a planarization process is performed to complete formation of damascene structure. Additionally, to satisfy requirements of low RC delay effects, low-K material, ultra low-k (ULK) material, or porous low-k material is used to be the dielectric layer in the damascene structure.

Please refer to FIGS. 1-5, which are schematic drawings of a conventional trench-first dual damascene process. As shown in FIG. 1, a substrate 10 having at least a conductive layer 12 and a base layer 14 comprising silicon nitride sequentially formed thereon is provided. And a dielectric layer 16, a cap layer 18, a metal hard mask layer 20, and a bottom anti-reflective coating (BARC) layer 22 are sequentially formed on the base layer 14. Then, a photoresist layer 30 is formed and patterned to form an opening 32 by a well-known photolithography method. The opening 32 is used to define a trench pattern of a damascene structure.

Please refer to FIGS. 1 and 2. Subsequently, an etching process is performed. Accordingly a trench recess 34 is etched into the metal hard mask layer 20 and the cap layer 18 through the opening 32. The etching is stopped on the cap layer 18. The remaining photoresist layer 30 and the BARC layer 22 are then stripped off.

As shown in FIG. 3, another BARC layer 36 is deposited over the substrate 10 and fills the trench recess 34. And another photoresist layer 40 is formed on the BARC layer 36. The photoresist layer 40 has an opening 42 patterned by a conventional photolithography method. The opening 42 is situated directly above the trench recess 34 and the conductive layer 12, and is used to define a via pattern of a damascene structure. As shown in FIG. 4, the BARC layer 36, the cap layer 18, and the dielectric layer 16 are etched through the opening 42 with the photoresist layer 40 being an etching mask. Thus, a partial via feature 44 is formed in an upper portion of the dielectric layer 16. Then the remaining photoresist layer 40 and the BARC layer 36 are stripped off by an oxygen plasma.

Please refer to FIG. 5. Next, the metal hard mask layer 20 serves as an etching hard mask in an etching process, which is performed to etch away the cap layer 18 and the dielectric layer 16 through the trench recess 34 and the partial via 44, thereby a dual damascene pattern comprising a trench opening 52 and a via opening 54 is obtained. Then, the damascene pattern is filled with a conductive metal such as copper followed by a planarization process that is performed, thus a dual damascene structure is formed. It is noteworthy that the dielectric layer 16 possesses a low mechanical strength and a compressive stress which leads to line distortion occurring in the dielectric layer 16.

Furthermore, there is another phenomenon drawing attention in the conventional damascene formation process: Generally, the cap layer 18 is a silicon oxide layer such as a tetra-ethyl-ortho-silicate (TEOS) based silicon oxide layer with TEOS used as a precursor. Because the TEOS layer comprises lots of Si—OH bonds and Si—H dangling bonds, the TEOS layer is a hydrophilic layer which is apt to absorb moisture. And the absorbed moisture is then desported from the TEOS layer and into the dielectric layer 16 in following process, thus Kelvin via open are formed in the dielectric layer 16. Kelvin via open reduces reliability of the process and influences electrical performance of the damascene interconnects formed following.

To solve the problem mentioned above, those skilled in the art provide many approaches, for example, a multi-layered cap layer such as a tri-layered cap layer is provided. The tri-layered cap layer provides a tensile stress layer offering a tensile stress which is opposite to the compressive stress of the dielectric layer. The multi-layered cap layer also provides hermetical layers sandwiching the tensile stress layer to prevent the tri-layered cap layer itself from absorbing the moisture and to prevent the dielectric layer from the desported moisture. However, due to the multi-layered characteristic, the process for the multi-layered cap layer has inferior process control, for example, it is not easy to form openings or recesses in the multi-layered cap layer. And The multi-layered cap layer also has inferior process stability. Therefore, a simple layer capable of balancing stress in the dielectric layer and preventing itself from absorbing moisture is needed.

SUMMARY OF THE INVENTION

Therefore the present invention provides a dielectric layer structure and a manufacturing method thereof to prevent line distortion and Kelvin via open formation in dielectric layer.

According to the claimed invention, a method for manufacturing a dielectric layer structure is provided, the method includes providing a substrate, blanketly forming a low-k dielectric layer of an interlayer dielectric (ILD) layer, the low-k dielectric layer covering at least a first metal interconnect structure on the substrate, blanketly forming a single tensile film of the ILD layer having a thickness of 200-1500 angstroms on the low-k dielectric layer, and performing a moisture preventing treatment on the single tensile film.

According to the claimed invention, a dielectric layer structure is provided. The dielectric layer structure comprises a low-k dielectric layer, and a single tensile hydrophobic film positioned on the low-k dielectric layer.

According to the dielectric layer structure and the method manufacturing thereof, the single tensile hydrophobic film is used to be a cap layer on the dielectric layer structure. Therefore a tensile stress comparative to the stress of the dielectric layer is provided to prevent line distortion in the dielectric layer. And the hydrophobic characteristic of the single tensile hydrophobic film prevents itself from moisture absorption, thus the Kelvin via open in the dielectric layer resulted by water desorbed from the single tensile hydrophobic film in following processes is also avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
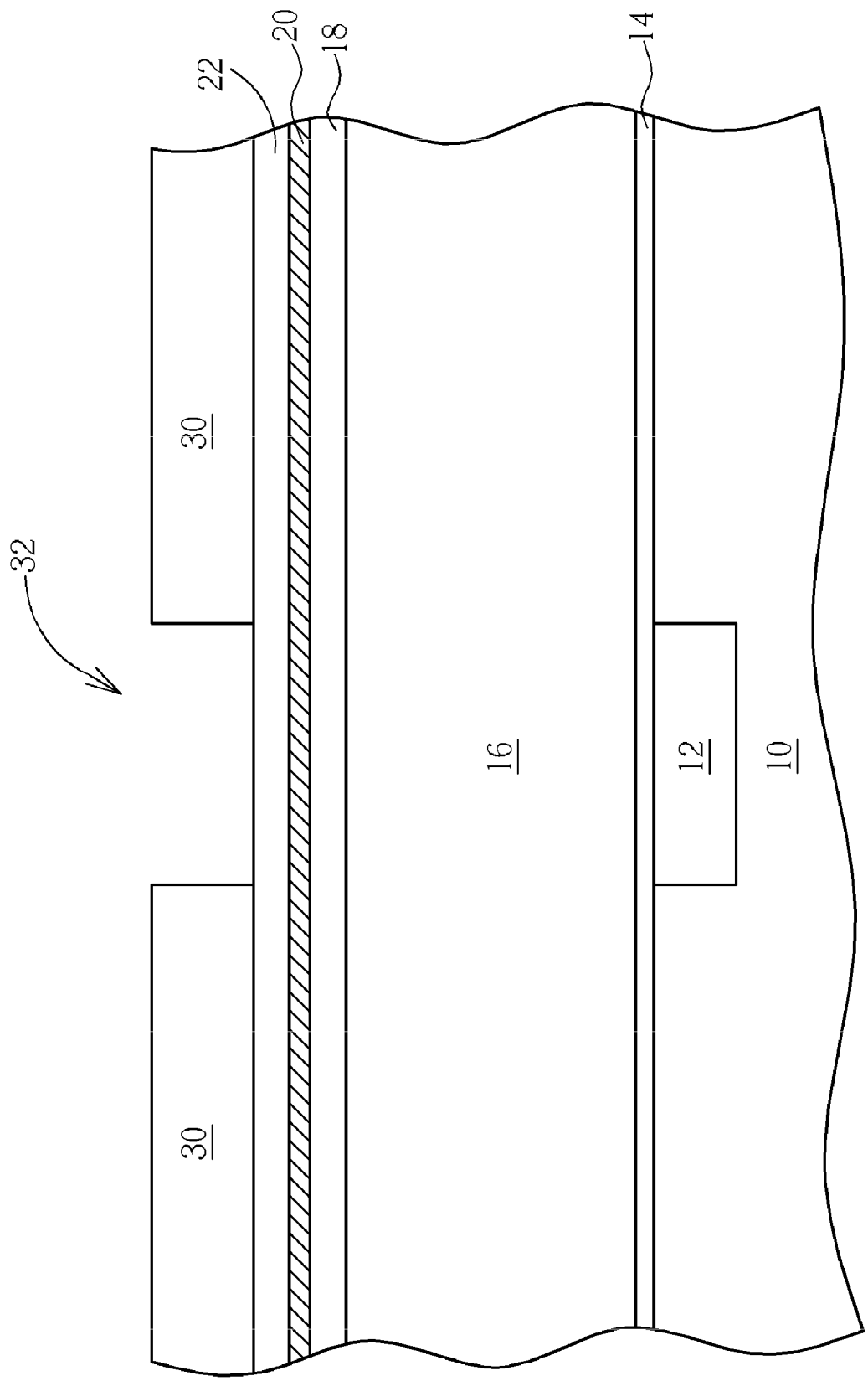
FIGS. 1-5 are schematic drawings of a conventional trench-first dual damascene process.
Figure 2:
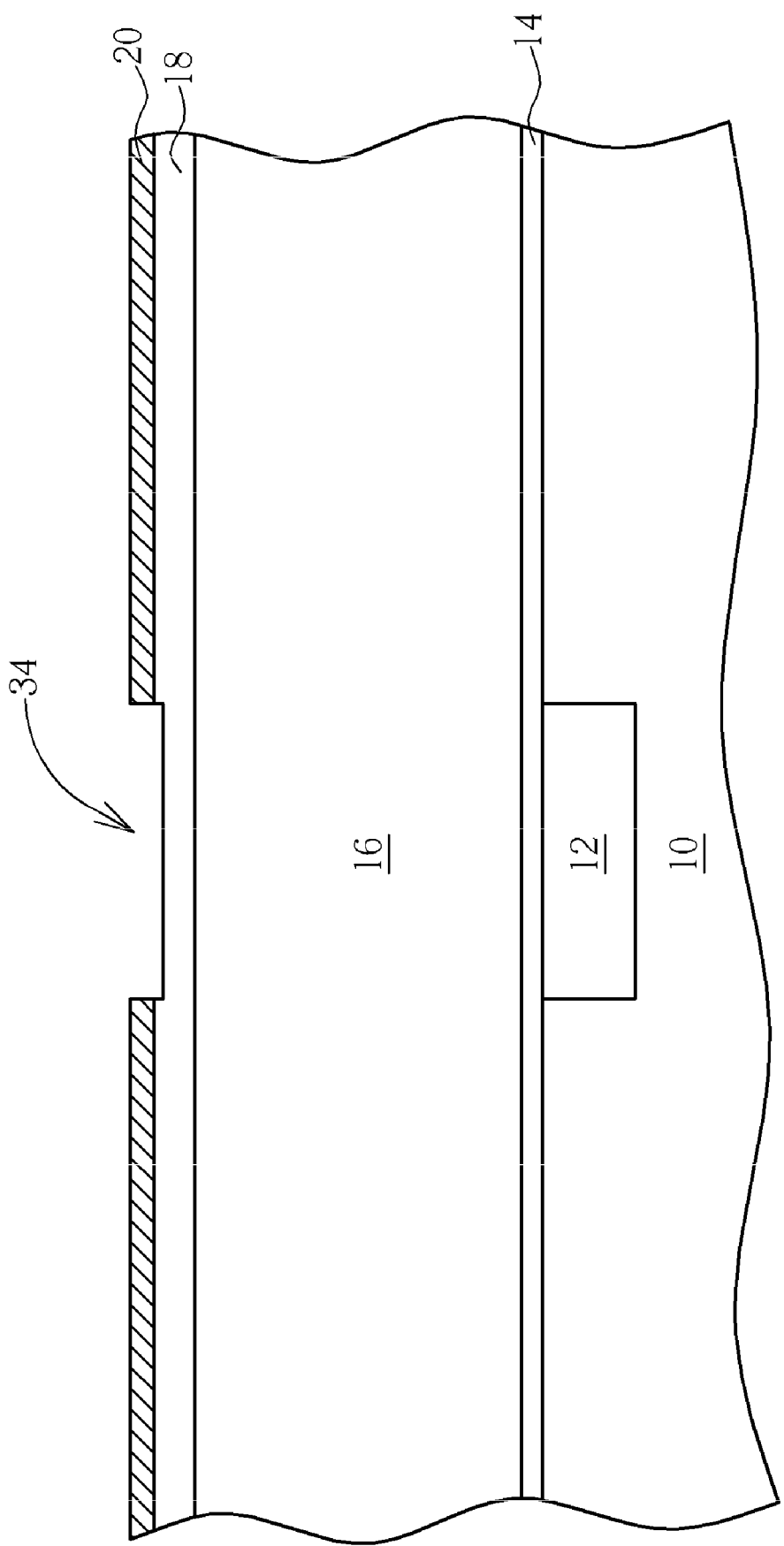
Figure 3:
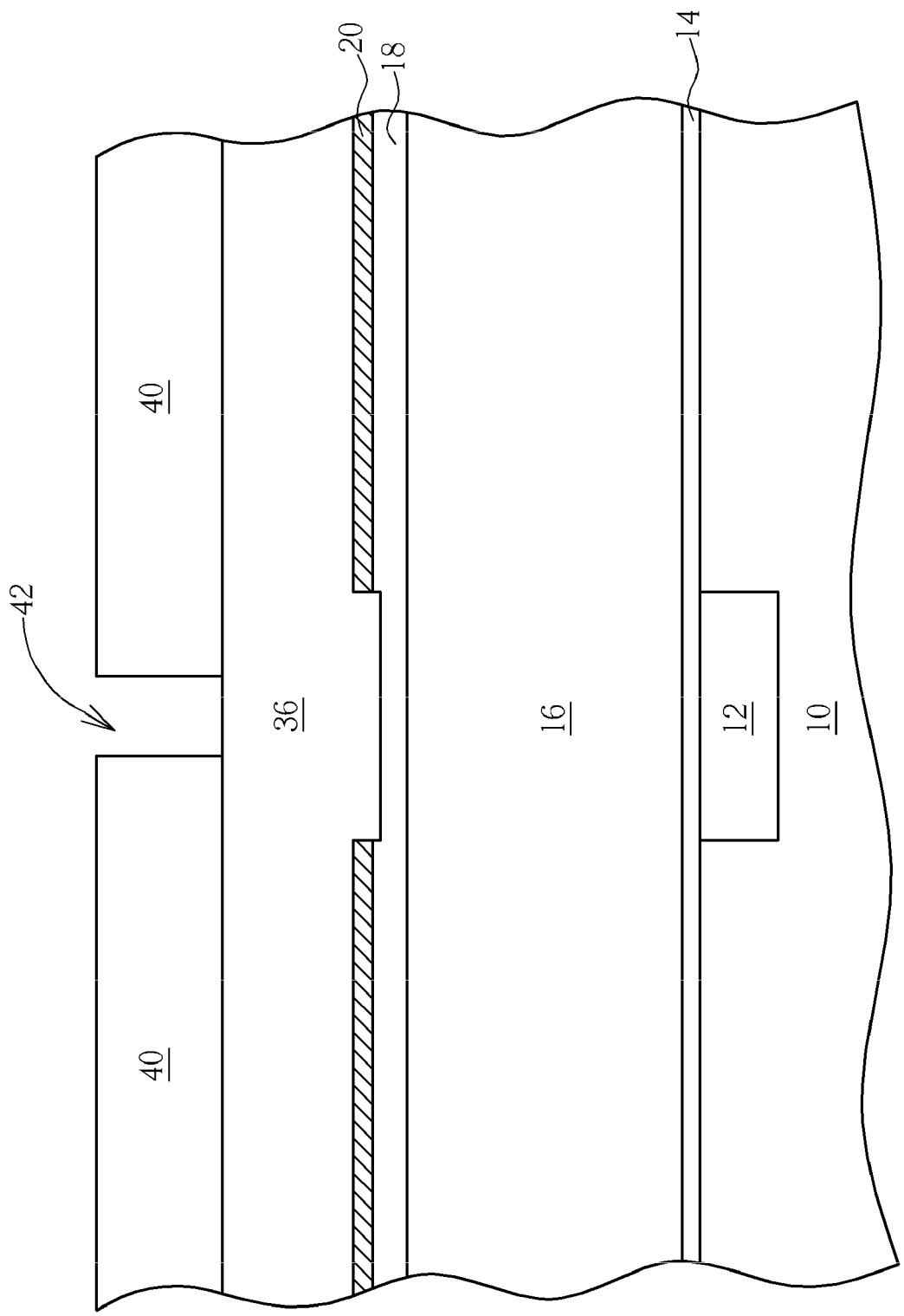
Figure 4:
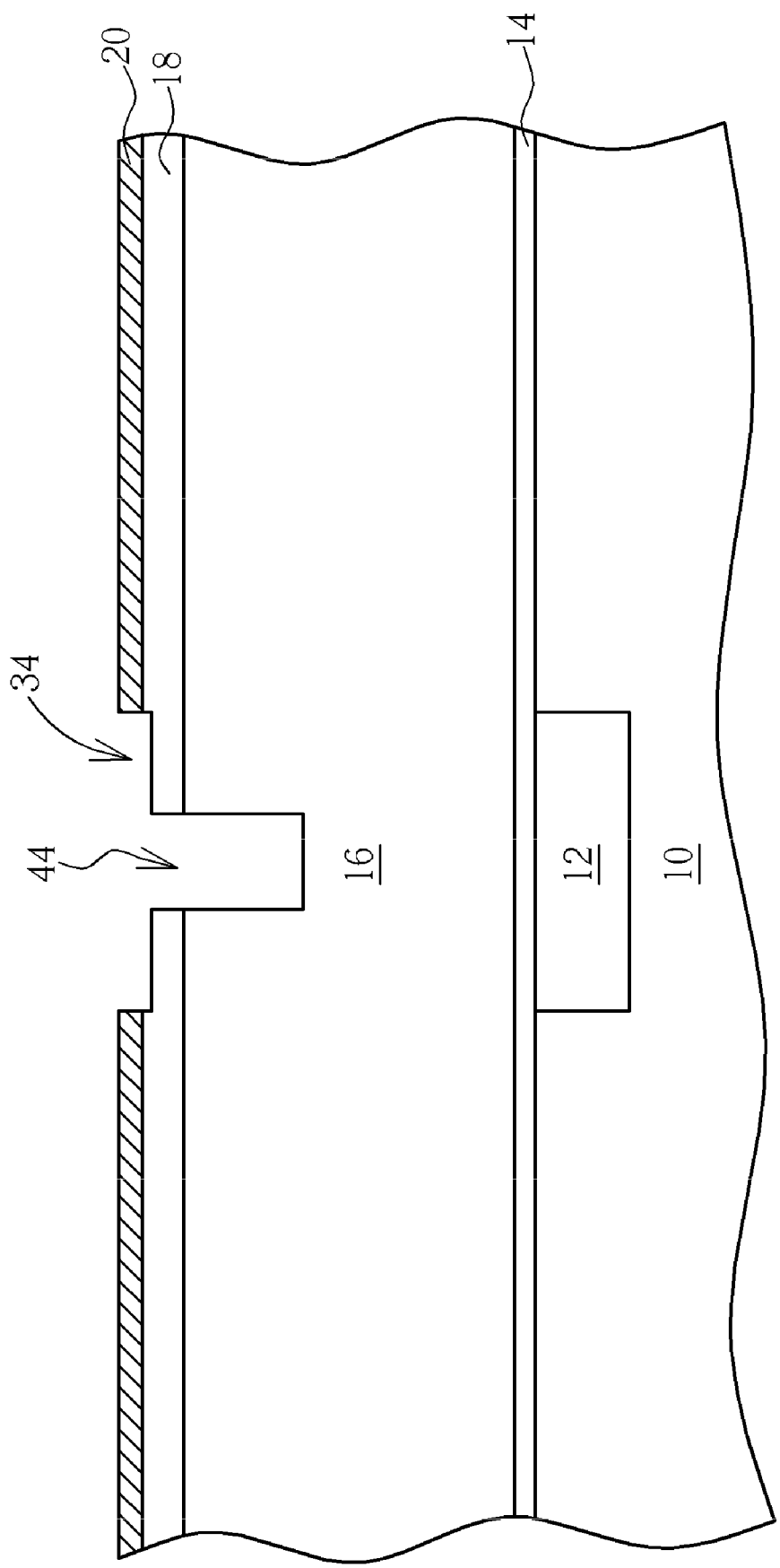
Figure 5:
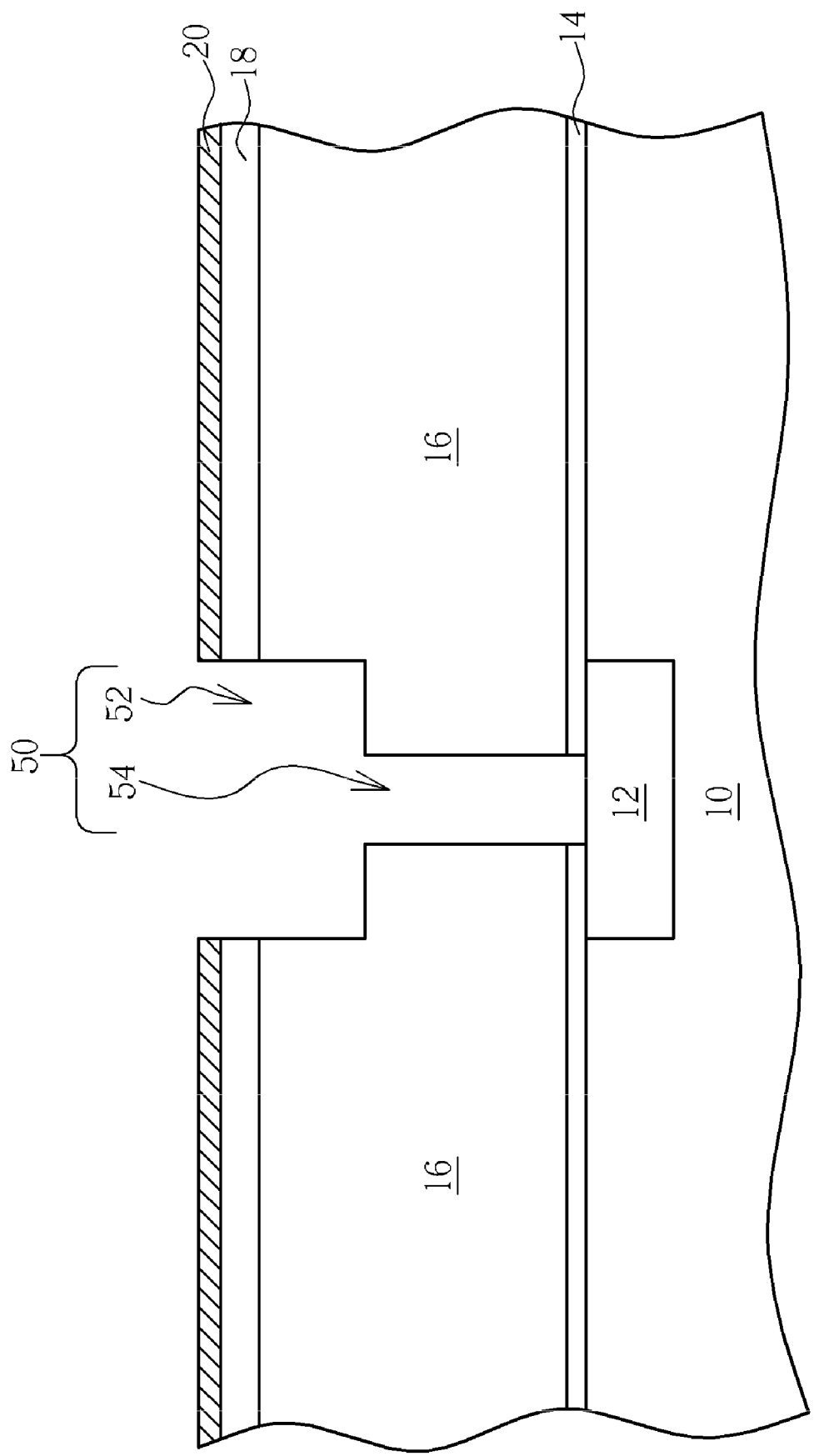
Figure 6:
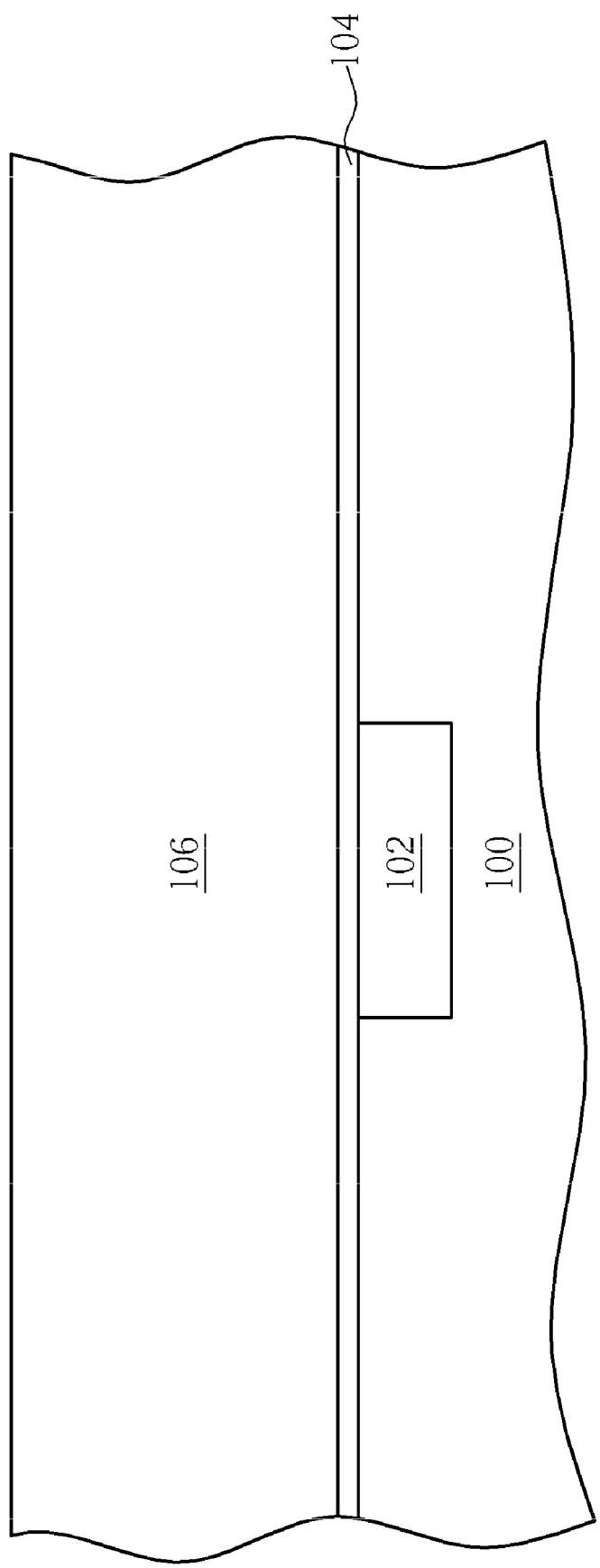
FIGS. 6-12 are schematic drawings illustrating a preferred embodiment of the method for manufacturing a dielectric layer structure.

Please refer to FIGS. 6-12, which are schematic drawings illustrating a preferred embodiment of the method for manufacturing a dielectric layer structure according to the present invention. As shown in FIG. 6, a substrate 100 is provided. The substrate 100 comprises a metal layer 102 serving as a conductive layer and a base layer 104 comprising silicon nitride or SiCHN. Then a low-k dielectric layer 106 is sequentially formed thereon. The low-k dielectric layer 106 comprises porous low-k dielectric material or ultra low-K (ULK) material. A thickness of the low-k dielectric layer 106 is about 800-5000 angstroms.

Figure 7:
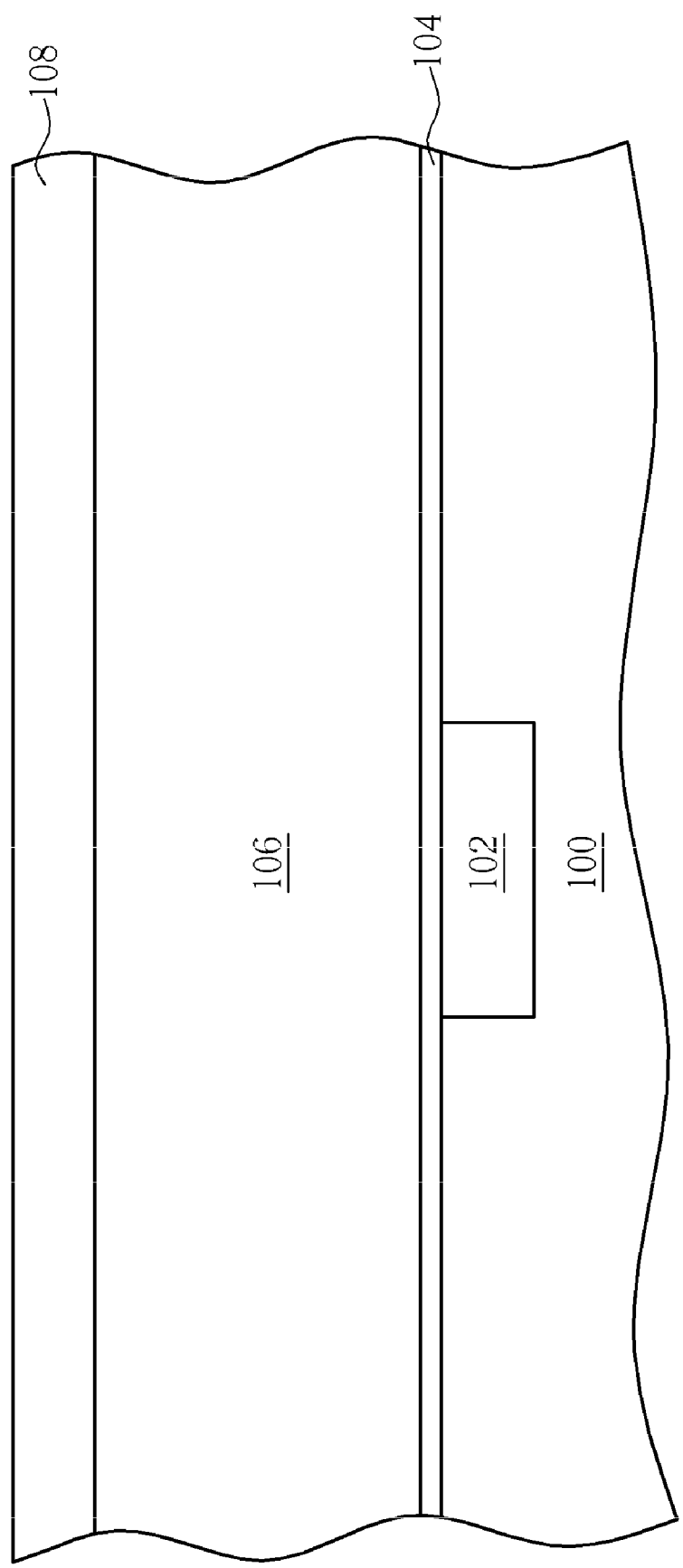

Please refer to FIG. 7. Next, a single tensile film 108 comprising tetra-ethyl-ortho-silicate (TEOS) is formed on the low-k dielectric layer 106 by a deposition process. The deposition process comprises a plasma-enhanced vapor deposition (PECVD) process, a sub-atmosphere chemical vapor deposition (SACVD) process, or an atmosphere chemical vapor deposition (APCVD) process. A high-frequency RF power and a low-frequency RF power of the deposition process can be adjusted to control the tensile stress of the single tensile film 108 according to the stress in the low-k dielectric layer 106. For example, when the high-frequency RF power is about 750-850 Watts and the low-frequency RF power is about 100-200 Watts, the tensile stress of the single tensile film 108 is about 50-100 MPa. A thickness of the single tensile film 108 is also adjustable according to the thickness of the low-k dielectric layer 106. For example, when the thickness of the low-k dielectric layer 106 is 800-5000 angstroms, the thickness of the single tensile film 108 is about 200-1500 angstroms.

Silane ($SiH_4$), TEOS, tetra-methyl silane (4 MS), tetra-methyl cyclo tetra-siloxane (TMCTS), diethoxy-methyl-silane (DEMS) or other silicon-containing chemicals can be added in the deposition processes as a precursor, and $CO_2$, $N_2O$, $O_2$, or $O_3$ can be added as an oxidizing agent. In addition, He, Ar, $N_2$, $NH_3$, $CO_2$, or $O_2$ can be used in the preferred embodiment for a pre-treatment or a post-treatment.

Figure 8:
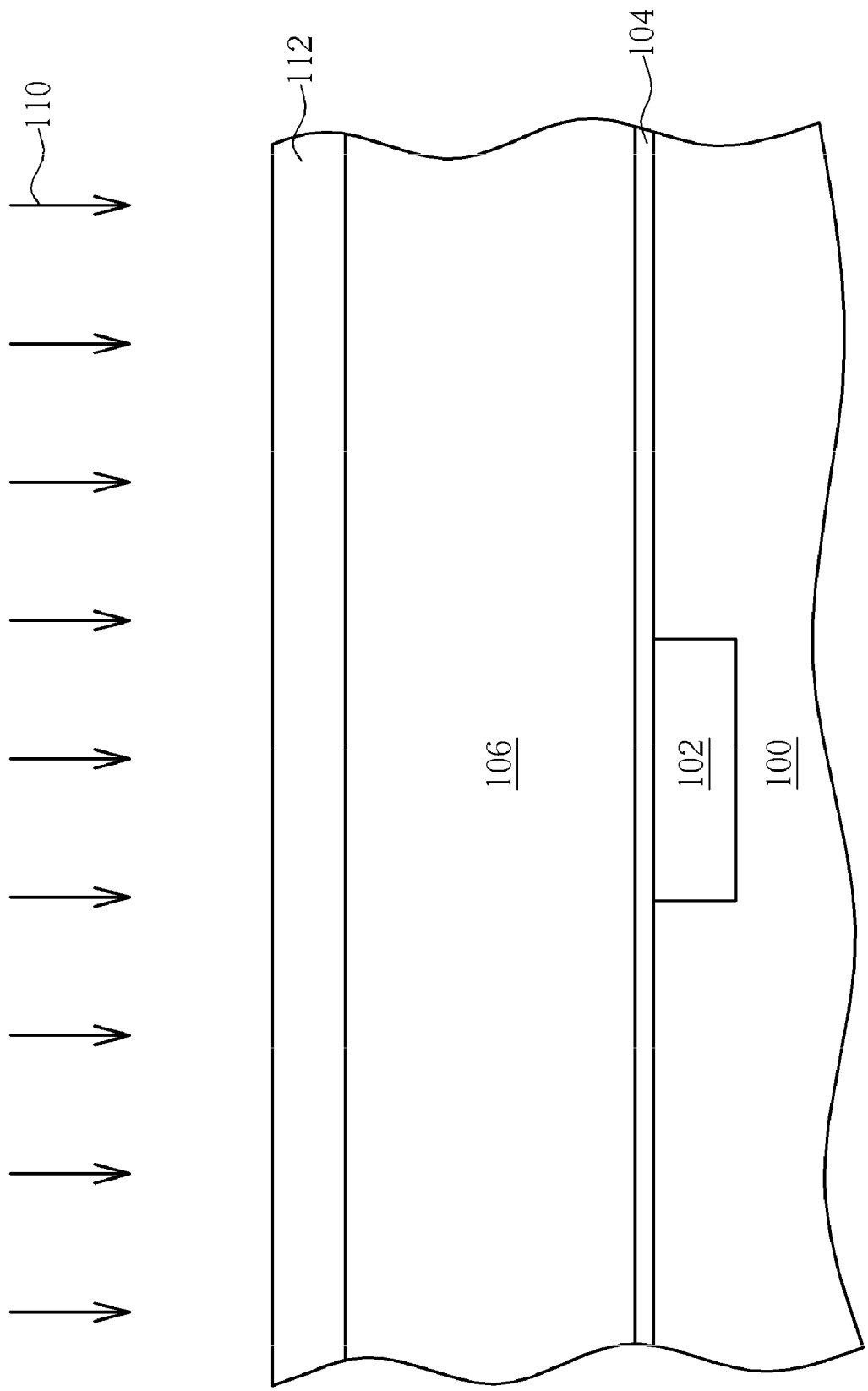
Figure 9:
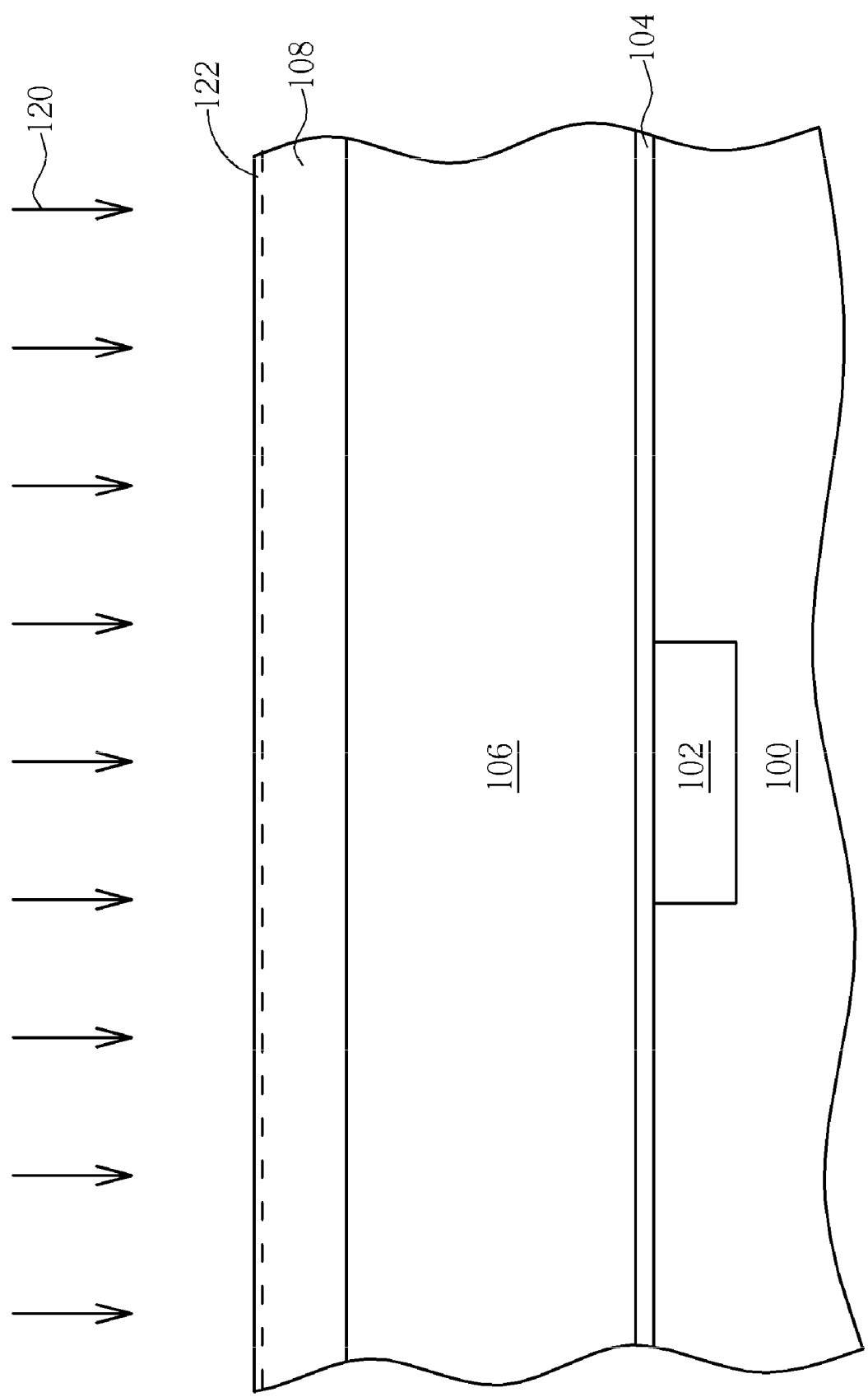

Please refer to FIG. 8. Then, a moisture preventing treatment is performed to the single tensile film 108. The moisture preventing treatment comprises an UV treatment, an electromagnetic treatment, or an N-plasma treatment. The moisture preventing treatment is used to alter the polarity of the single tensile film 108 for enhancing moisture preventing effect of the single tensile film 108. For example, the UV treatment is performed with an UV light 110 having a wavelength of 50-400 nanometers (nm) at a temperature of about 250-450° C. for 1-5 minutes. In the UV treatment, the UV light 110 is used to break the Si—OH bonds and the Si—H dangling bonds in the single tensile film 108. Therefore the Si—OH bonds and the Si—H dangling bonds are eliminated and Si—O bonds or Si—Si bonds are formed. Thus the polarity of the single tensile film 108 is altered from hydrophilic into hydrophobic and a single tensile hydrophobic film 112 is obtained as shown in FIG. 8. Moreover, the N-plasma treatment is performed with an N-containing plasma for nitrifying a surface of the single tensile film 108, and thus a hydrophobic surface 122 is obtained as shown in FIG. 9.

Figure 10:
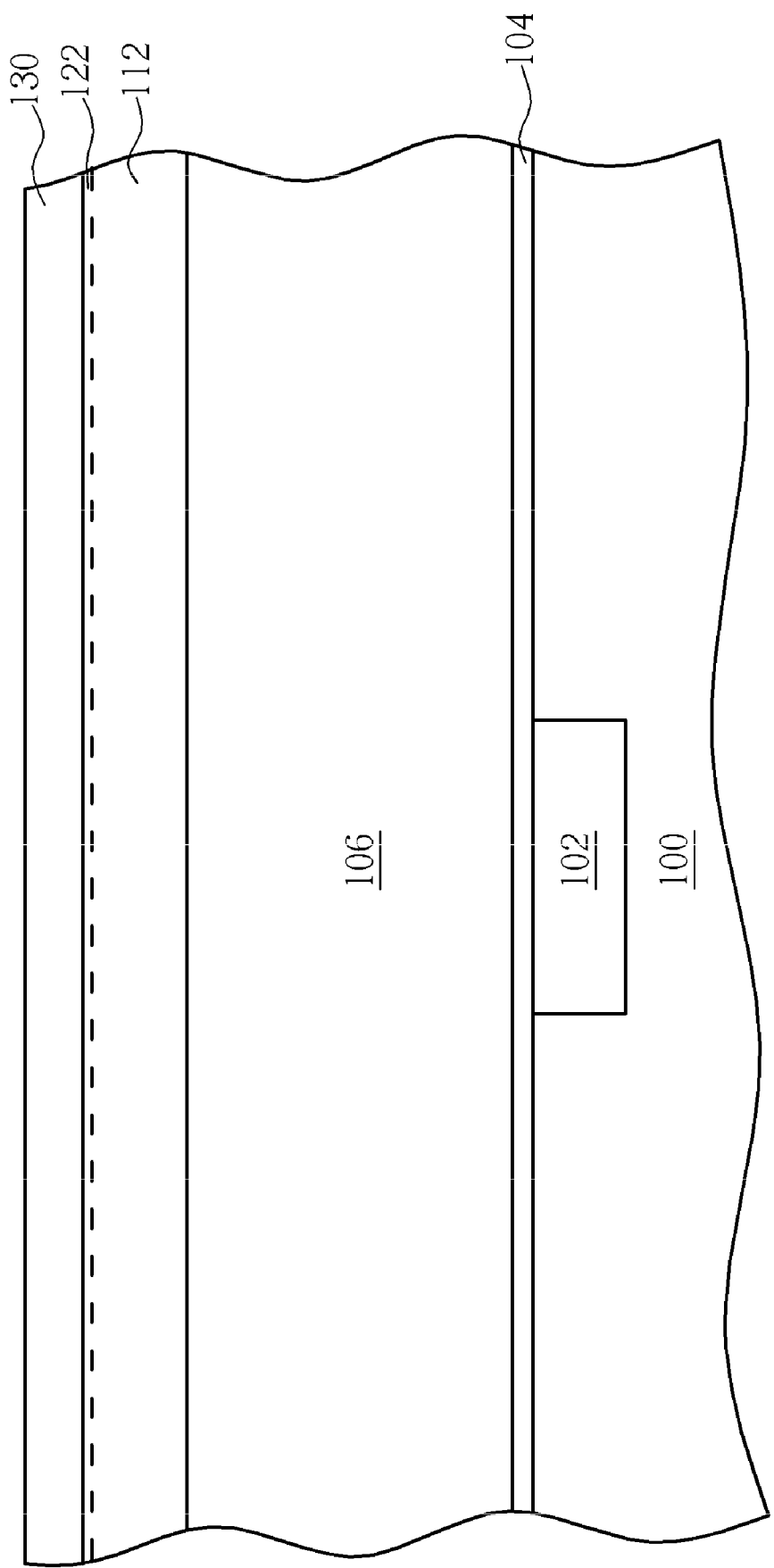

Please refer to FIG. 10. After performing the moisture preventing treatment, a metal hard mask layer 130 comprising TiN is formed on the single tensile film 108. When forming the metal hard mask layer 130, the substrate 100 is placed in an nitrogen environment, then an N-plasma is introduced to bombard a Ti metal target, thus the metal hard mask layer 130 comprising TiN is formed. It is noteworthy that before bombarding the Ti metal target, said N-plasma can be used in the N-plasma treatment, therefore the hydrophobic surface 122 is obtained and the step of forming the metal hard mask layer 130 can be performed in the same apparatus. Thus it can be seen that the N-plasma treatment, which is one approach of the moisture preventing treatment, and the step of forming the metal hard mask layer 130 can be performed in-situ. Of course the moisture preventing treatment and the step of forming the metal hard mask layer 130 can be performed ex-situ. Furthermore, as shown in FIG. 10, the single tensile film 108 can be altered to be the single tensile hydrophobic film 112 with the UV treatment first, then its surface can be treated to be the hydrophobic surface 122 with the N-plasma treatment, and the metal hard mask layer 130 can be formed in the same apparatus.

Figure 11:
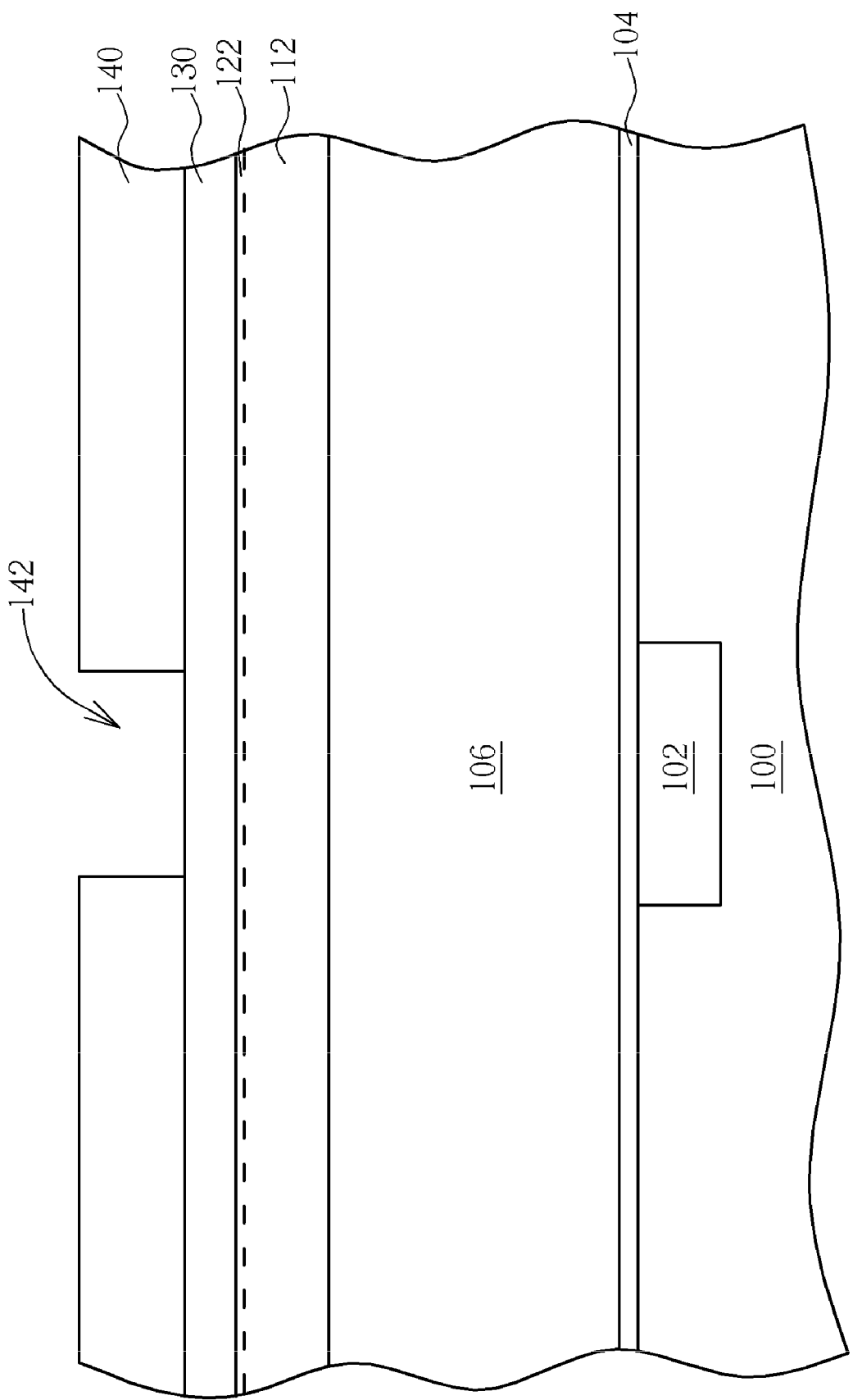
Figure 12:
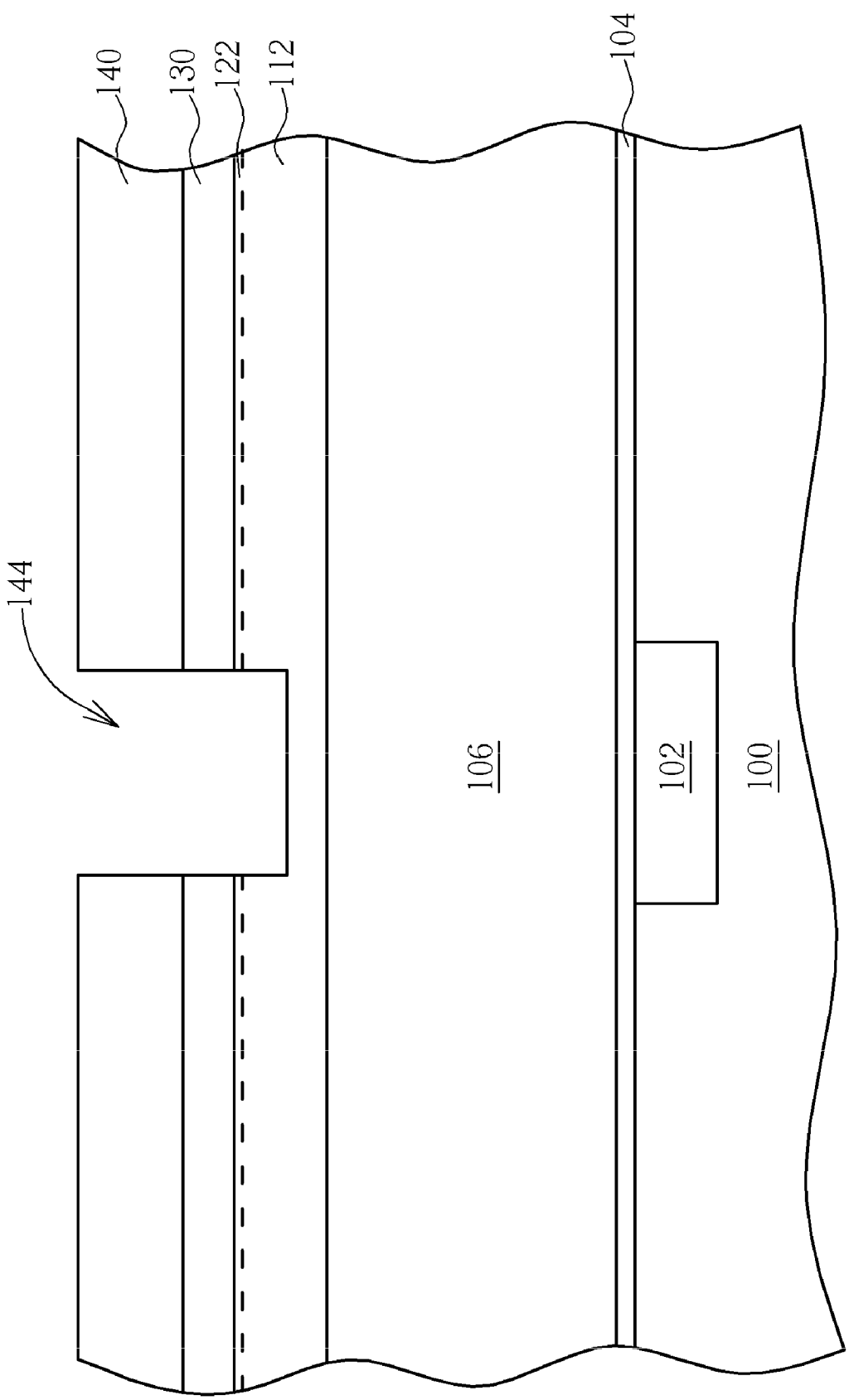

Please refer to FIGS. 11-12. Then, a photoresist layer 140 is formed on the metal hard mask layer 130. Additionally, a bottom anti-reflective coating (BARC) layer (not shown) can be formed on the metal hard mask layer 130. And a conventional photolithography method is performed to pattern the photoresist 140, thus an opening 142 used to define a pattern is formed as shown in FIG. 11. Please refer to FIG. 12, an etching process is performed to etch the metal hard mask layer 130 to the single tensile hydrophobic film 112 through the opening 142 and to form an opening 144. A depth of the opening 144 is not limited as shown in FIG. 12 and is adjustable according to requirements of the process, even to penetrate the single tensile hydrophobic film 112.

According to the method for manufacturing dielectric layer structure provided by the present invention, the compressive stress of the low-k dielectric layer 106 can be balanced by the tensile stress provided by the single tensile film 108, therefore pattern or line distortion in the low-k dielectric layer 106 due to the compressive stress is avoided effectively. And the single tensile film 108 which comprises hydrophilic TEOS is altered in to the single tensile hydrophobic film 112, even to further comprise the hydrophobic surface 122 by the moisture preventing treatments, therefore the moisture absorption is effectively prevented. Thus problems of moisture absorption in the low-k dielectric layer 106 from the single tensile film 108 and moisture desorption from the low-k dielectric layer 106 in following processes which causes Kelvin via open are fundamentally prevented. Additionally, when the low-k dielectric layer 106 comprises porous low-k dielectric material or ULK material which is more susceptible to the contaminant and damage, the single tensile film 108 provided by the present invention can prevent defects such Kelvin via open more effectively. Therefore process stability is improved. What is noteworthy is that due to the single tensile hydrophobic film 112 comprising only one lamination, the entire process further benefits from simpler process control and superior process stability.

Please refer to FIGS. 8 and 9 again. As mentioned above, the present invention provides a dielectric layer structure comprising a low-k dielectric layer 106 and a single tensile hydrophobic film 112 positioned on the low-k dielectric layer 106. The low-k dielectric layer 106 comprises porous low-k dielectric material or ULK material. A thickness of the low-k dielectric layer 106 is about 800-5000 angstroms.

The single tensile hydrophobic film 112 comprises TEOS. A thickness of the single tensile hydrophobic film 112 can be adjusted according to the thickness of the low-k dielectric layer 106 therefore a range of the thickness of the single tensile hydrophobic film 112 is 200-5000 angstroms. The single tensile hydrophobic film 112 possess a tensile stress which is comparative to a compressive stress of the low-k dielectric layer 106. The single tensile hydrophobic film 112 can comprise a nitrified surface serving as a hydrophobic surface 122.

According to the dielectric layer structure provided by the present invention, the compressive stress of the low-k dielectric layer 106 can be balanced by the tensile stress provided by the single tensile hydrophobic film 112, therefore pattern or line distortion in the low-k dielectric layer 106 is avoided effectively. And since the single tensile hydrophobic film 112 has the hydrophobic feature, moisture will not be absorbed, therefore the moisture absorption is effectively prevented. Thus problems of moisture absorption in the low-k dielectric layer 106 from the single tensile film 108 and moisture desorption from the low-k dielectric layer 106 in following processes which causes Kelvin via open are fundamentally prevented.

Additionally, the dielectric layer structure provided by the present invention further comprises a metal hard mask layer (shown in FIG. 10) positioned on the single tensile hydrophobic film 112 for defining patterns and protecting the low-k dielectric layer 106.

As mentioned above, according to the dielectric layer structure and the method manufacturing thereof, the single tensile hydrophobic film is used to balance a comparative stress of the former layer such as the dielectric layer, therefore pattern or line distortion in the dielectric layer is prevented. And the hydrophobic characteristic of the single tensile hydrophobic film prevents itself from moisture absorption, thus the Kelvin via open in the dielectric layer resulted by water desorpted from the tensile hydrophobic film in following processes is also avoided. In other words, the dielectric layer structure provided by the present invention not only effectively improves the process control and process stability of the entire process, but also improves the process result.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a dielectric layer comprising steps of:
    providing a substrate;
    blanketly forming a low-k dielectric layer of an interlayer dielectric (ILD) layer, the low-k dielectric layer covering at least a first metal interconnect structure on the substrate;
    blanketly forming a single tensile film of the ILD layer having a thickness of 200-1500 angstroms on the low-k dielectric layer, the single tensile film comprising a tensile stress of about 50-100 MPa; and
    performing a moisture preventing treatment on the single tensile film.

2. The method of claim 1, wherein the substrate further comprises at least a metal layer.

3. The method of claim 1, wherein the low-k dielectric layer comprises porous low-k dielectric material or ultra low-k (ULK) dielectric material.

4. The method of claim 1, wherein the low-k dielectric layer comprises a thickness of 800-5000 angstroms.

5. The method of claim 1, wherein the single tensile film comprises tetra-ethyl-ortho-silicate (TEOS) formed by a deposition process.

6. The method of claim 5, wherein the deposition process comprises a plasma-enhanced vapor deposition (PECVD) process, a sub-atmosphere chemical vapor deposition (SACVD) process, or an atmosphere chemical vapor deposition (APCVD) process.

7. The method of claim 1, wherein the moisture preventing treatment comprises an UV treatment, an electromagnetic treatment, or an N-plasma treatment.

8. The method of claim 7, wherein the UV treatment comprises a UV light with a wavelength of 50-400 nm.

9. The method of claim 8, wherein the UV treatment is performed for 1-5 minutes.

10. The method of claim 7, wherein the UV treatment is used to break Si—OH bonds or Si—H dangling bonds in the single tensile film.

11. The method of claim 7, wherein the N-plasma treatment is used to nitrify the single tensile film and to form a hydrophobic surface on the single tensile film.

12. The method of claim 1 further comprising a step of forming a metal hard mask layer on the single tensile film after the moisture preventing treatment.

13. The method of claim 12, wherein the metal hard mask layer comprises TiN.

14. The method of claim 13, wherein the step of forming the metal hard mask layer is performed in a nitrogen environment.

15. The method of claim 14, wherein the step of forming the metal hard mask layer and the moisture preventing treatment are performed in-situ.

16. The method of claim 12, wherein the step of forming the metal hard mask layer and the moisture preventing treatment are performed ex-situ.

17. The method of claim 12 further comprising a step of forming at least an opening in the metal hard mask, the single tensile film, and the low-k dielectric layer for exposing the first metal interconnect structure.

18. A method for manufacturing a dielectric layer comprising steps of:
    providing a substrate;
    blanketly forming a low-k dielectric layer of an interlayer dielectric (ILD) layer, the low-k dielectric layer covering at least a first metal interconnect structure on the substrate;
    blanketly forming a single tensile film of the ILD layer having a thickness of 200-1500 angstroms on the low-k dielectric layer;
    performing a moisture preventing treatment on the single tensile film; and
    forming a metal hard mask layer on the single tensile film, the metal hard mask layer comprising TiN and being formed in a nitrogen environment in-situ with the moisture preventing treatment.

19. A method for manufacturing a dielectric layer comprising steps of:

providing a substrate;

blanketly forming a low-k dielectric layer of an interlayer dielectric (ILD) layer, the low-k dielectric layer covering at least a first metal interconnect structure on the substrate;

blanketly forming a single tensile film of the ILD layer having a thickness of 200-1500 angstroms on the low-k dielectric layer; and performing a moisture preventing treatment comprising an N-plasma treatment for nitrifying the single tensile film to form a hydrophobic surface on the single tensile film.

* * * * *